United States Patent
Fukagawa et al.

(10) Patent No.: US 7,630,536 B2
(45) Date of Patent: Dec. 8, 2009

(54) PRINTING INSPECTION APPARATUS, PRINTING INSPECTION METHOD, PRINTING INSPECTION DATA GENERATING APPARATUS, AND PRINTING INSPECTION DATA GENERATING METHOD

(75) Inventors: Takahiro Fukagawa, Ogori (JP); Yuji Otake, Fukuoka (JP); Takashi Katsuki, Onojyo (JP); Minoru Murakami, Chikushino (JP); Kimiyuki Yamasaki, Ogori (JP)

(73) Assignee: Panasonic Corporation, Osaka (JP)

( * ) Notice: Subject to any disclaimer, the term of this patent is extended or adjusted under 35 U.S.C. 154(b) by 673 days.

(21) Appl. No.: 10/626,140

(22) Filed: Jul. 24, 2003

(65) Prior Publication Data
US 2004/0146195 A1   Jul. 29, 2004

(30) Foreign Application Priority Data
Jul. 25, 2002   (JP)   ............................ P2002-216327
Jul. 25, 2002   (JP)   ............................ P2002-216328

(51) Int. Cl.
*G06K 9/00* (2006.01)
(52) U.S. Cl. ...................................... 382/151; 382/141
(58) Field of Classification Search ........................ None
See application file for complete search history.

(56) References Cited

U.S. PATENT DOCUMENTS

| 4,978,224 | A | * | 12/1990 | Kishimoto et al. ........... 356/394 |
| 5,134,575 | A |   | 7/1992  | Takagi |
| 5,608,816 | A | * | 3/1997  | Kawahara et al. ............ 382/149 |
| 5,991,435 | A | * | 11/1999 | Tsujikawa et al. ........... 382/147 |
| 6,729,532 | B2 | * | 5/2004 | Inoue et al. ................. 228/254 |
| 2002/0112348 | A1 |   | 8/2002 | Inoue et al. |

FOREIGN PATENT DOCUMENTS

| CN | 1350422       | 5/2002 |
| EP | 0 612 203 A1  | 8/1994 |
| EP | 0 638 801 A1  | 2/1995 |
| JP | 20004079      | 1/2000 |
| JP | 2000-326495   | 11/2000 |
| JP | 2002-029033   | 1/2002 |

OTHER PUBLICATIONS

Chinese Office Action Dated Aug. 31, 2007.

\* cited by examiner

*Primary Examiner*—Bhavesh M Mehta
*Assistant Examiner*—Alex Liew
(74) *Attorney, Agent, or Firm*—Pearne & Gordon LLP

(57) ABSTRACT

To provide a printing inspection apparatus and a printing inspection method enabling an optimal inspection mode in which a balance is kept between the improvement of production efficiency and the securing of a printing accuracy.

In a printing inspection for inspecting a printing state of cream solder on a substrate after screen printing, inspection data is generated by dividing unit shape and position data, indicating the shapes and the positions of element solder print portions to be printed on electrodes provided on a circuit forming surface of the substrate to be used to bond electronic components, into data groups according to a grouping condition chosen in response to an inspection mode. A go/no-go judgment at the time of inspection is made per data group, and a judgment result is displayed for each data group. It is thus possible to choose an optimal inspection mode flexibly in response to the characteristics of a substrate as the subject to be inspected.

20 Claims, 14 Drawing Sheets

FIG. 9

INSPECTION THRESHOLD LIBRARY

| NO. | OPENING TYPE | THRESHOLD DATA | | | | | |
|---|---|---|---|---|---|---|---|
| | | (−) NG | (−) WARNING | (−) OK | (+) OK | (+) WARNING | (+) NG |
| 1 | SQUARE TYPE 1 | 60 | 70 | 90 | 110 | 130 | 150 |
| 2 | RECTANGLE TYPE 1 | 60 | 70 | 90 | 110 | 130 | 150 |
| 3 | | | | | | | |
| 4 | | | | | | | |

| NO. | NAME OF COMPONENTS | THRESHOLD DATA | | | | | |
|---|---|---|---|---|---|---|---|
| | | (−) NG | (−) WARNING | (−) OK | (+) OK | (+) WARNING | (+) NG |
| 1 | P1 | 50 | 65 | 80 | 120 | 140 | |
| 2 | P2 | 50 | 60 | 75 | 125 | 150 | |
| 3 | | | | | | | |

PRINTING INSPECTION APPARATUS, PRINTING INSPECTION METHOD, PRINTING INSPECTION DATA GENERATING APPARATUS, AND PRINTING INSPECTION DATA GENERATING METHOD

BACKGROUND OF THE INVENTION

1. Field of the Invention

The present invention relates to a printing inspection apparatus and a printing inspection method for inspecting a printing state of cream solder printed on a substrate, and to a method of generating inspection data used in a printing inspection apparatus for inspecting a printing state of cream solder printed on a substrate.

2. Description of the Related Art

When electronic components are packaged, cream solder is applied on the surface of a substrate before the electronic components are mounted on the substrate. A screen printing method is used extensively as a method of applying cream solder, and a printing inspection is performed after the printing step to inspect a printing state of the cream solder. According to this printing inspection, an image of the substrate after the screen printing is picked up by a camera, and an image pick-up result is subjected to image processing in judging whether cream solder is printed exactly on print portions.

Prior to the printing inspection, inspection data, specifying print portions where the cream solder is to be printed on a substrate as the subject to be inspected, is inputted into the printing inspection apparatus. The inspection data specifies shapes and positions of the print portions on the substrate, and data specifying the printing shapes and positions of solder print portions set on the top surfaces of electrodes provided on a circuit forming surface of the substrate to be used to bond electronic components is inputted for individual electrodes.

Incidentally, the electronic components to be mounted on the substrate have diverse characteristics, and an inspection accuracy in the solder printing step described as above varies depending on the electronic components to be mounted after the printing. In other words, for print portions on which expensive electronic components that demand a high reliability and thereby need a satisfactory printing accuracy are to be mounted, an inspection has to be performed by a method that can ensure a printing accuracy in a reliable manner. On the contrary, for print portions on which electronic components that can be readily bonded through soldering and thereby do not place importance on a printing accuracy are to be mounted, an inspection has to be completed as short a time as possible. For this reason, it is preferable for a printing inspection apparatus performing an inspection to enable a flexible inspection mode in response to the characteristics of the electronic components to be mounted on the substrate as the subject to be inspected.

However, the electrodes used to bond the electronic components are normally formed in the order of thousands to tens of thousands per substrate. Hence, for a flexible inspection mode to be chosen as described above, inspection data and a range to be inspected have to be inputted each time a substrate is changed to another substrate of a different kind. In particular, because a ratio of limited production of diversified products has been on the increase recently in the production pattern at the manufacturing location of electronic equipment, such a data processing work has to be performed for substrates of many kinds at a high frequency. This work, however, is so tedious that it becomes a factor that hinders the improvement of productivity. As has been described, the conventional printing inspection apparatus has a difficulty in achieving an optimal inspection mode in which a balance is kept between the improvement of production efficiency and the securing of a printing accuracy.

Also, the electrodes used to bond the electronic components are normally formed in the order of thousands to tens of thousands per substrate. For this reason, when the aforementioned inspection data is generated or the data is inputted into the printing inspection apparatus, enormous work and time are consumed on the data processing. In particular, because a ratio of limited production of diversified products has been on the increase recently in the production pattern at the manufacturing location of electronic equipment, a data processing work, such as generation and input of inspection data, has to be performed for the substrates of many kinds at a high frequency, and in this regard, there has been a need for a measure for making the data processing work more efficient.

SUMMARY OF THE INVENTION

It is therefore an object of the invention to provide a printing inspection apparatus and a printing inspection method enabling an optimal inspection mode in which a balance is kept between the improvement of production efficiency and the securing of a printing accuracy.

It is another object of the invention to provide a printing inspection data generating apparatus and a printing inspection data generating method enabling efficient data processing of the inspection data.

A first aspect of the invention provides a printing inspection apparatus for inspecting a printing state of cream solder on a substrate after screen printing, which includes: image pick-up means for picking up an image of the substrate; printing judging means for making a go/no-go judgment of the printing state based on an image pick-up result of the substrate from the image pick-up means and inspection data needed to perform a printing inspection; and display means for displaying a judgment result. The inspection data is generated by classifying element shape and position data indicating shapes and positions of element solder print portions formed through printing on electrodes provided on a circuit forming surface of the substrate to be used to bond electronic components, into data groups grouped according to a grouping condition, and the display means displays the judgment result in connection with the data groups.

A second aspect of the invention provides a printing inspection apparatus according to the first aspect, wherein the grouping condition is determined based on a geometrical range on a printing surface of the substrate, and the printing judging means makes a judgment of the printing state using only a data group grouped as falling within an inspection performance range.

A third aspect of the invention provides a printing inspection apparatus according to the first aspect, wherein the grouping condition is determined based on an attribute of the electronic components, and the printing judging means makes a judgment of the printing state using only a data group grouped as being an electronic component having an attribute specified as a subject to be inspected.

A fourth aspect of the invention provides a printing inspection apparatus according to the first aspect, wherein the grouping condition is determined so as to make a one-to-one correspondence between the electronic components and the data groups, and the display means displays the judgment result for each data group.

A fifth aspect of the invention provides a printing inspection method for inspecting a printing state of cream solder on a substrate after screen printing, which includes: a printing judging step of making a go/no-go judgment of the printing state based on inspection data generated by classifying unit shape and position data, indicating shapes and positions of element solder print portions formed through printing on electrodes provided on a circuit forming surface of the substrate to be used to bond electronic components, into data groups grouped according to a grouping condition, and an image pick-up result of the substrate from image pick-up means; and a displaying step of displaying a judgment result in connection with the data groups.

A sixth aspect of the invention provides a printing inspection method according to the fifth aspect, wherein the grouping condition is determined based on a geometrical range on a printing surface of the substrate, and a judgment of the printing state is made by using only a data group grouped as falling within an inspection performance range.

A seventh aspect of the invention provides a printing inspection method according to the fifth aspect, wherein the grouping condition is determined based on an attribute of the electronic components, and a judgment of the printing state is made by using only a data group grouped as being an electronic component having an attribute specified as a subject to be inspected.

An eighth aspect of the invention provides a printing inspection method according to the fifth aspect, wherein the grouping condition is determined so as to make a one-to-one correspondence between the electronic components and the data groups, and the judgment result is displayed for each data group.

A ninth aspect of the invention provides a printing inspection data generating apparatus for generating inspection data used in a printing inspection apparatus for inspecting a printing state of cream solder on a substrate after screen printing and containing shape and position data indicating shapes and positions of solder print portions formed by printing the cream solder on a printing surface, which includes: data providing means for providing element shape and position data indicating shapes and positions of element solder print portions formed on respective electrodes provided on a circuit forming surface of the substrate to be used to bond electronic components; and grouping means for classifying the element shape and position data into data groups grouped according to a grouping condition to identify individual data groups.

A tenth aspect of the invention provides a printing inspection data generating apparatus according to the ninth aspect, wherein the grouping condition is determined based on a geometrical range on the printing surface of the substrate.

An eleventh aspect of the invention provides a printing inspection data generating apparatus according to the ninth aspect, wherein the grouping condition is determined based on an attribute of the electronic components.

A twelfth aspect of the invention provides a printing inspection data generating apparatus according to the ninth aspect, wherein the grouping condition is determined so as to make one group for each of the electronic components.

A thirteenth aspect of the invention provides a printing inspection data generating apparatus according to the ninth aspect, which further includes specific inspection data giving means for giving specific inspection data to the individual data groups.

A fourteenth aspect of the invention provides a printing inspection data generating apparatus according to any of the ninth through thirteenth aspects, wherein the data providing means provides element shape and position data obtained based on mask opening data detected from a mask plate to be used for the screen printing.

A fifteenth aspect of the invention provides a printing inspection data generating method for generating inspection data used in a printing inspection apparatus for inspecting a printing state of cream solder on a substrate after screen printing and containing shape and position data indicating shapes and positions of solder print portions formed by printing the cream solder on a printing surface, wherein element shape and position data, indicating shapes and positions of element solder print portions formed on respective electrodes provided on a circuit forming surface of the substrate to be used to bond electronic components, is classified into data groups grouped according to a grouping condition to identify individual data groups.

A sixteenth aspect of the invention provides a printing inspection data generating method according to the fifteenth aspect, wherein the grouping condition is determined based on a geometrical range on the printing surface of the substrate.

A seventeenth aspect of the invention provides a printing inspection data generating method according to the fifteenth aspect, wherein the grouping condition is determined based on an attribute of the electronic components.

An eighteenth aspect of the invention provides a printing inspection data generating method according to the fifteenth aspect, wherein the grouping condition is determined so as to make one group for each of the electronic components.

A nineteenth aspect of the invention provides a printing inspection data generating method according to the fifteenth aspect, wherein specific inspection data is given to the individual data groups.

A twentieth aspect of the invention provides a printing inspection data generating method according to any of the fifteenth through nineteenth aspects, wherein the element shape and position data is provided based on mask opening data detected from a mask plate to be used for the screen printing.

According to one of the aspects of the invention, a printing state is judged by comparing the inspection data, which is generated by classifying unit shape and position data indicating the shapes and the positions of unit print portions to be printed on the electrodes into data groups grouped according a grouping condition, with an image pick-up result of the substrate from the image pick-up means, and a judgment result is displayed in connection with the data groups. It is thus possible to perform an inspection according to importance or the order of priority of the inspection set in response to a kind of the substrate.

Also, according to one of the aspects of the invention, the element shape and position data indicating the shapes and the positions of the element solder print portions to be printed on the electrodes provided on the circuit forming surface of the substrate to be used to bond the electronic components is divided into groups according a grouping condition. It is thus possible to perform data processing of the inspection data efficiently.

BRIEF DESCRIPTION OF THE DRAWINGS

FIG. 9 is an explanatory view of an inspection threshold library of the screen printing apparatus according to one embodiment of the invention.

DESCRIPTION OF THE PREFERRED EMBODIMENTS

Figure 1:
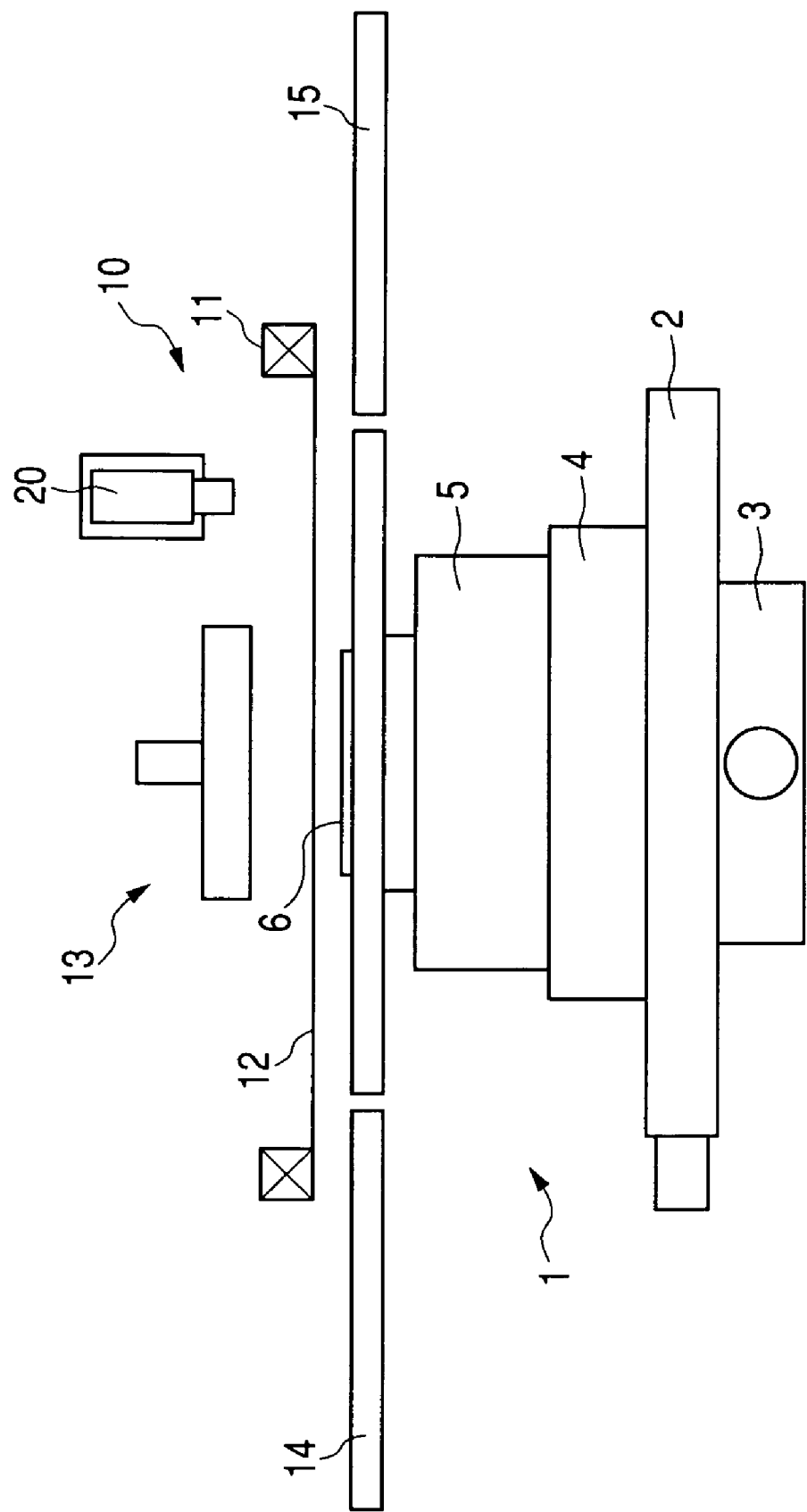
FIG. 1 is a front view of a screen printing apparatus according to one embodiment of the invention.
Figure 2:
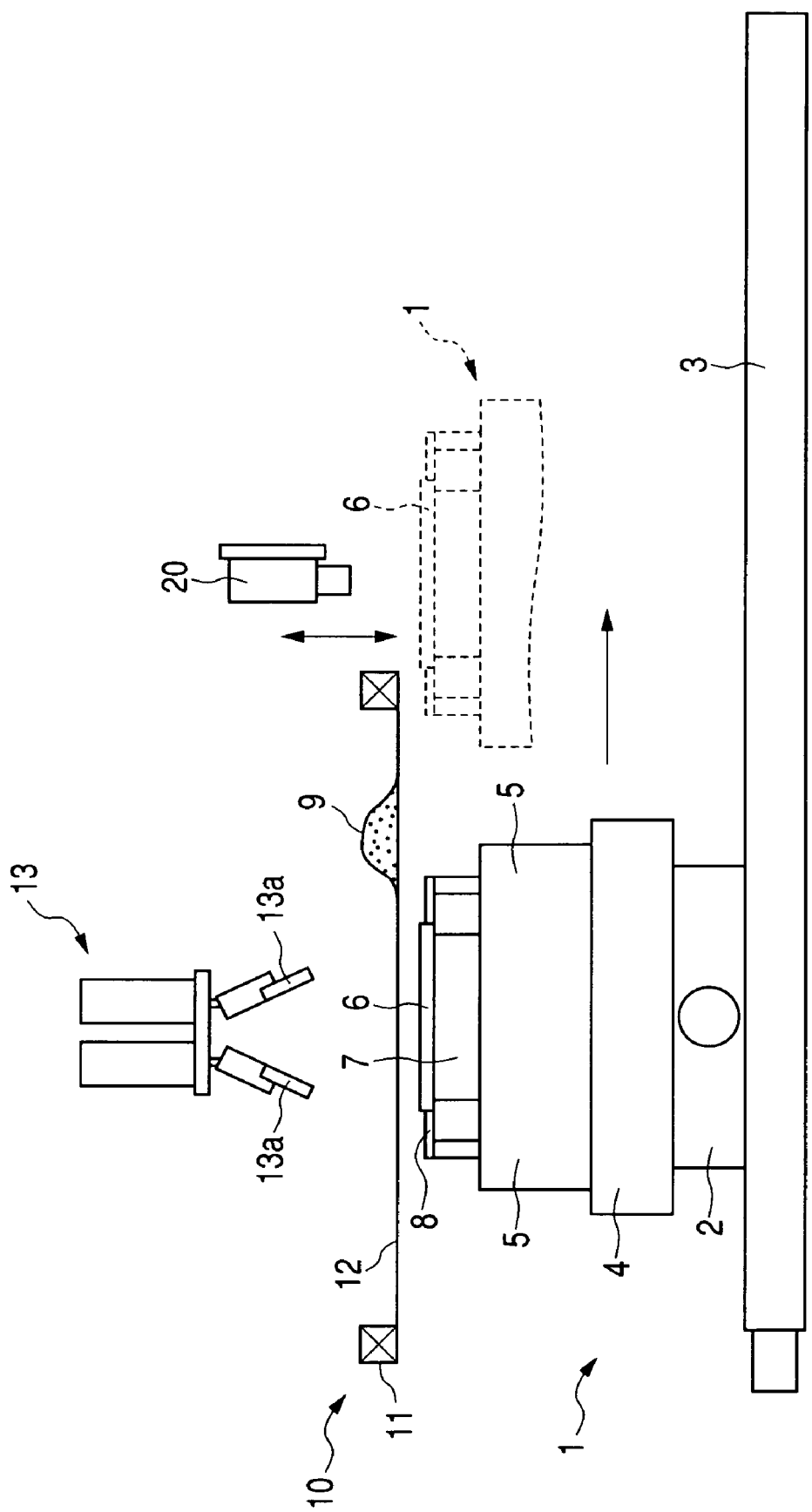
FIG. 2 is a side view of the screen printing apparatus according to one embodiment of the invention.
Figure 3:
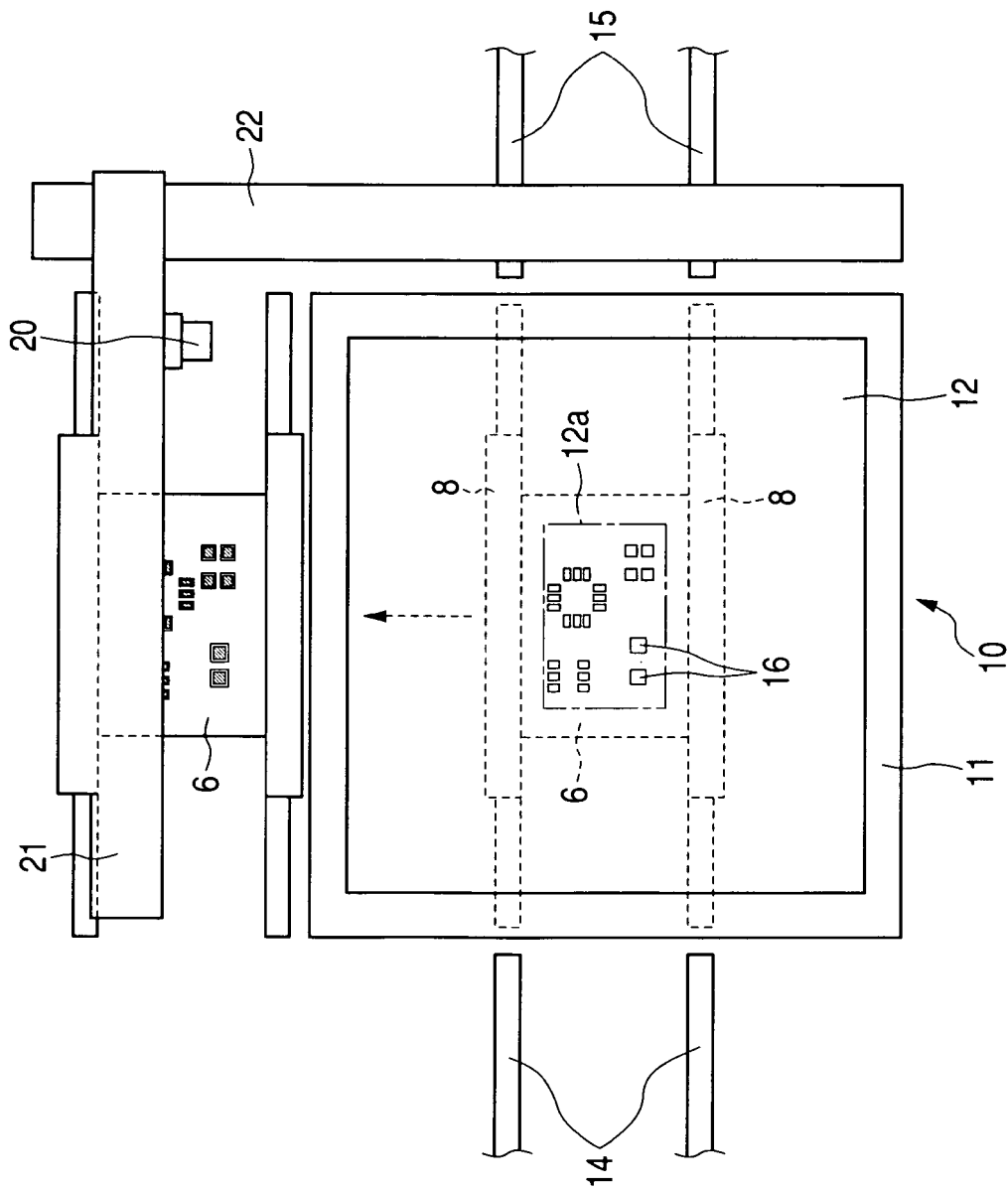
FIG. 3 is a plan view of the screen printing apparatus according to one embodiment of the invention.
Figure 4A:
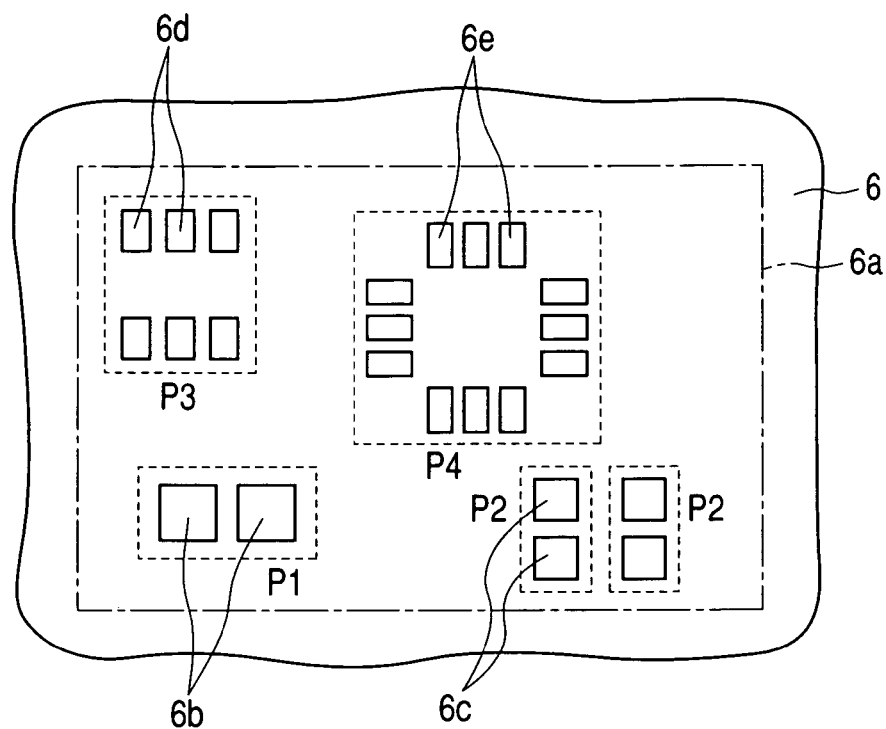
FIG. 4(*a*) and FIG. 4(*b*) are plan views of a substrate printing surface to be printed by the screen printing apparatus according to one embodiment of the invention.
Figure 4B:
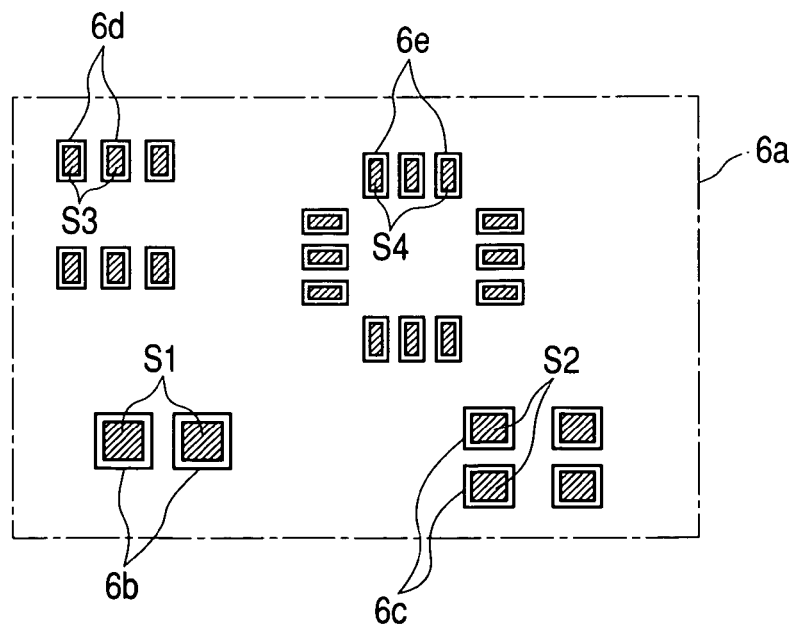
Figure 5:
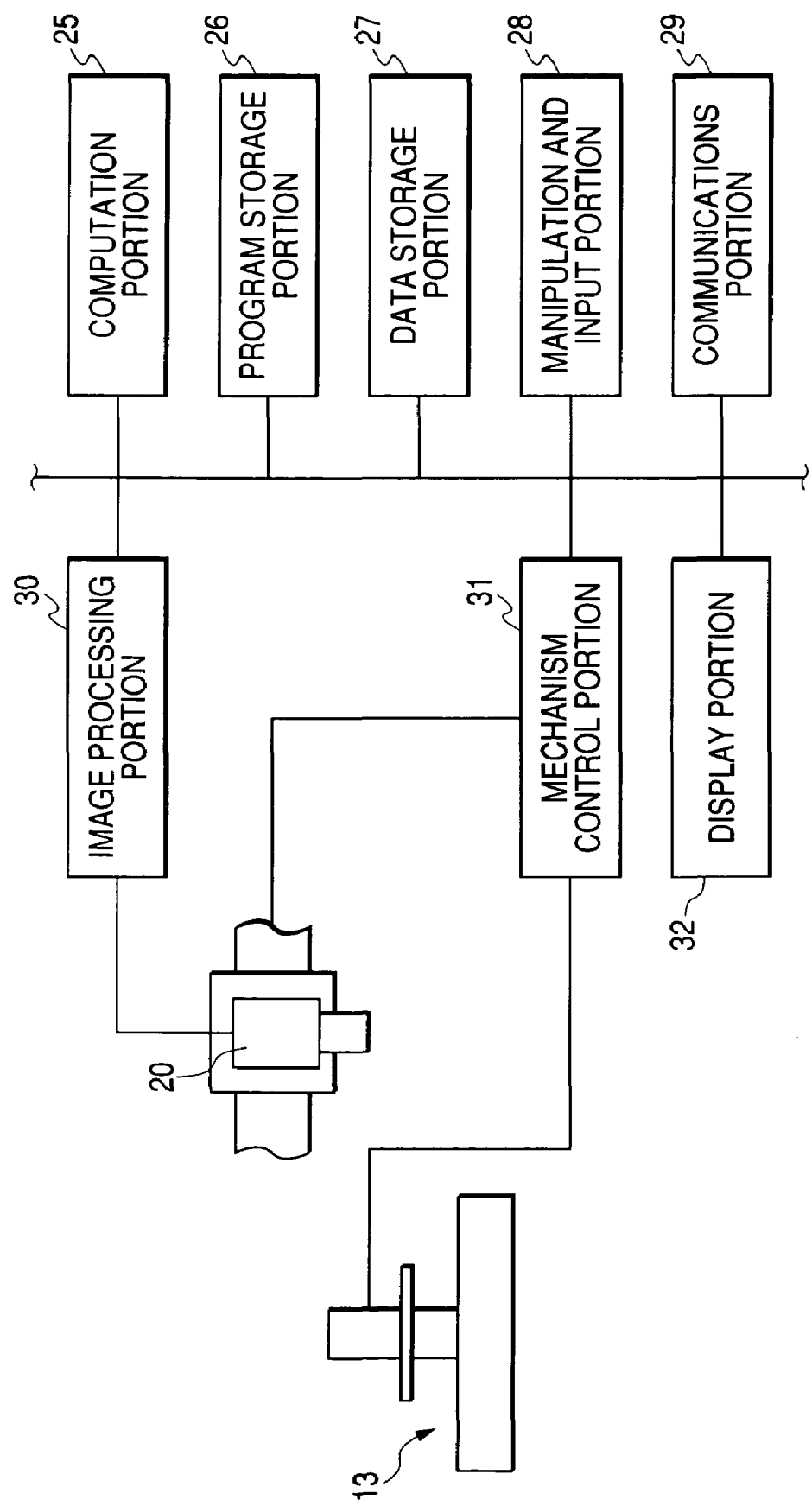
FIG. 5 is a block diagram depicting an arrangement of a control system of the screen printing apparatus according to one embodiment of the invention.
Figure 6:
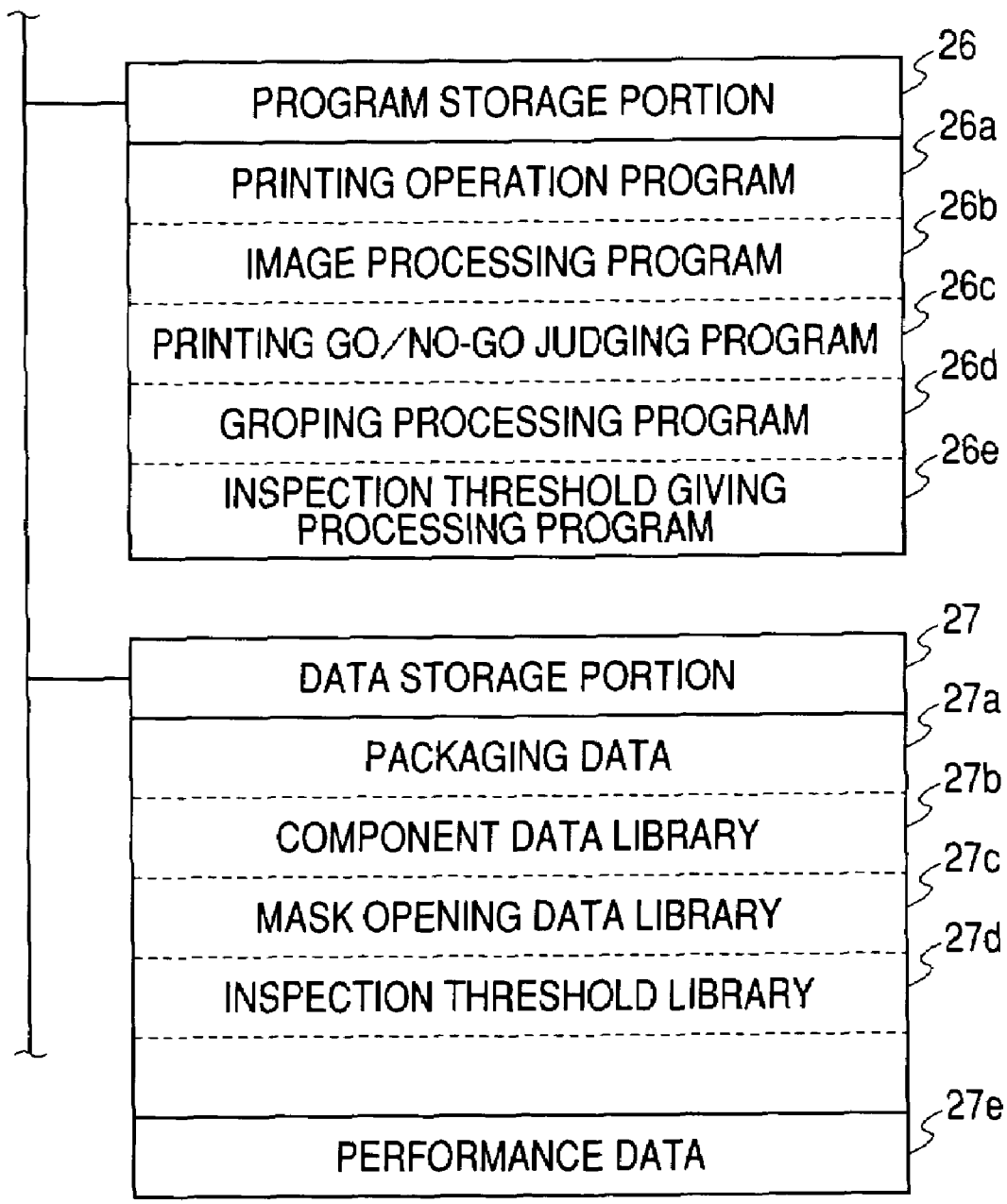
FIG. 6 is a view showing storage contents in a program storage portion and in a data storage portion of the screen printing apparatus according to one embodiment of the invention.
Figure 7:
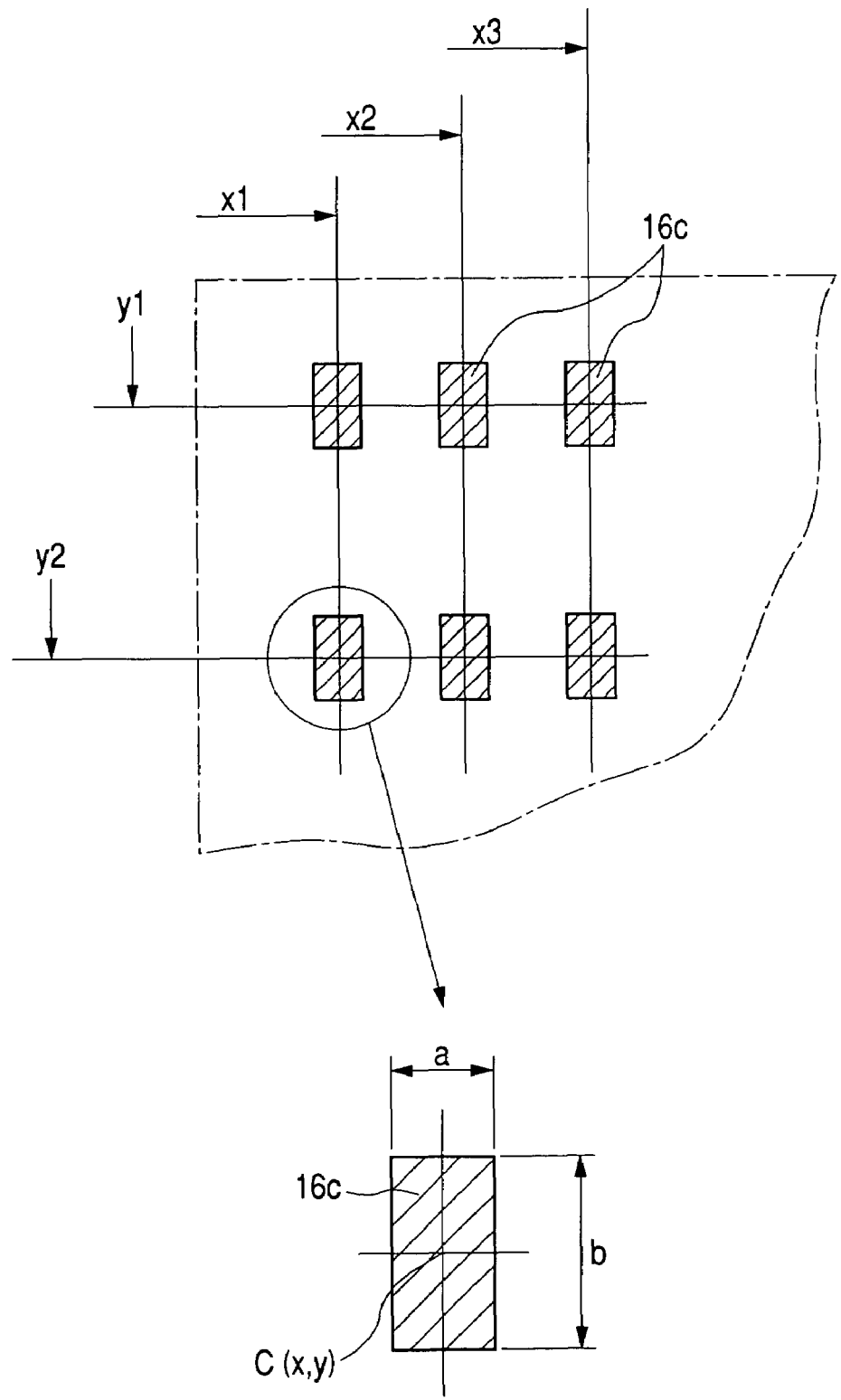
FIG. 7 is an explanatory view of element shape and position data of element solder print portions to be printed by the screen printing apparatus according to one embodiment of the invention.
Figure 8:
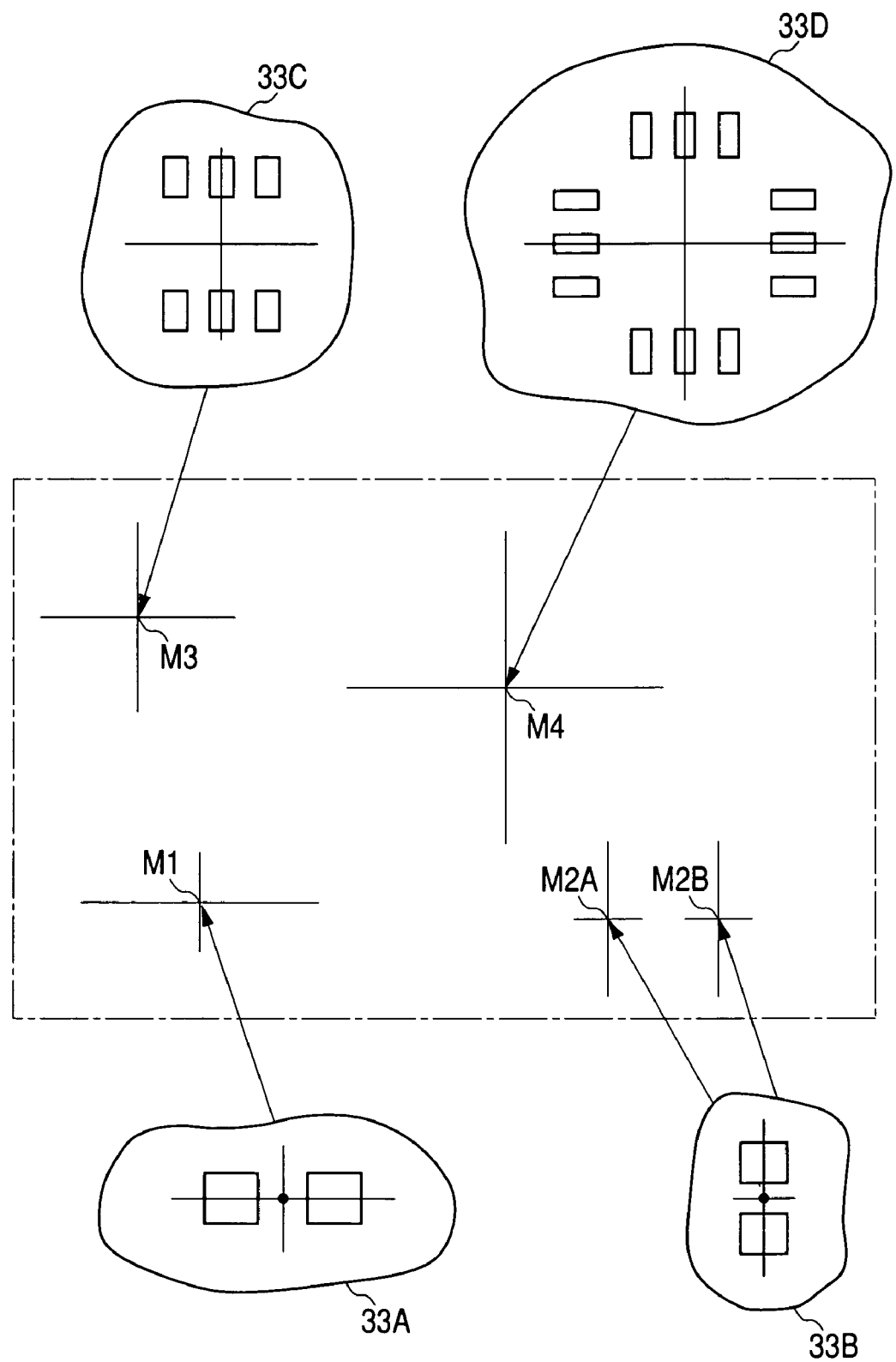
FIG. 8 is an explanatory view of packaging data and mask opening patterns used in the screen printing apparatus according to one embodiment of the invention.
Figure 10:
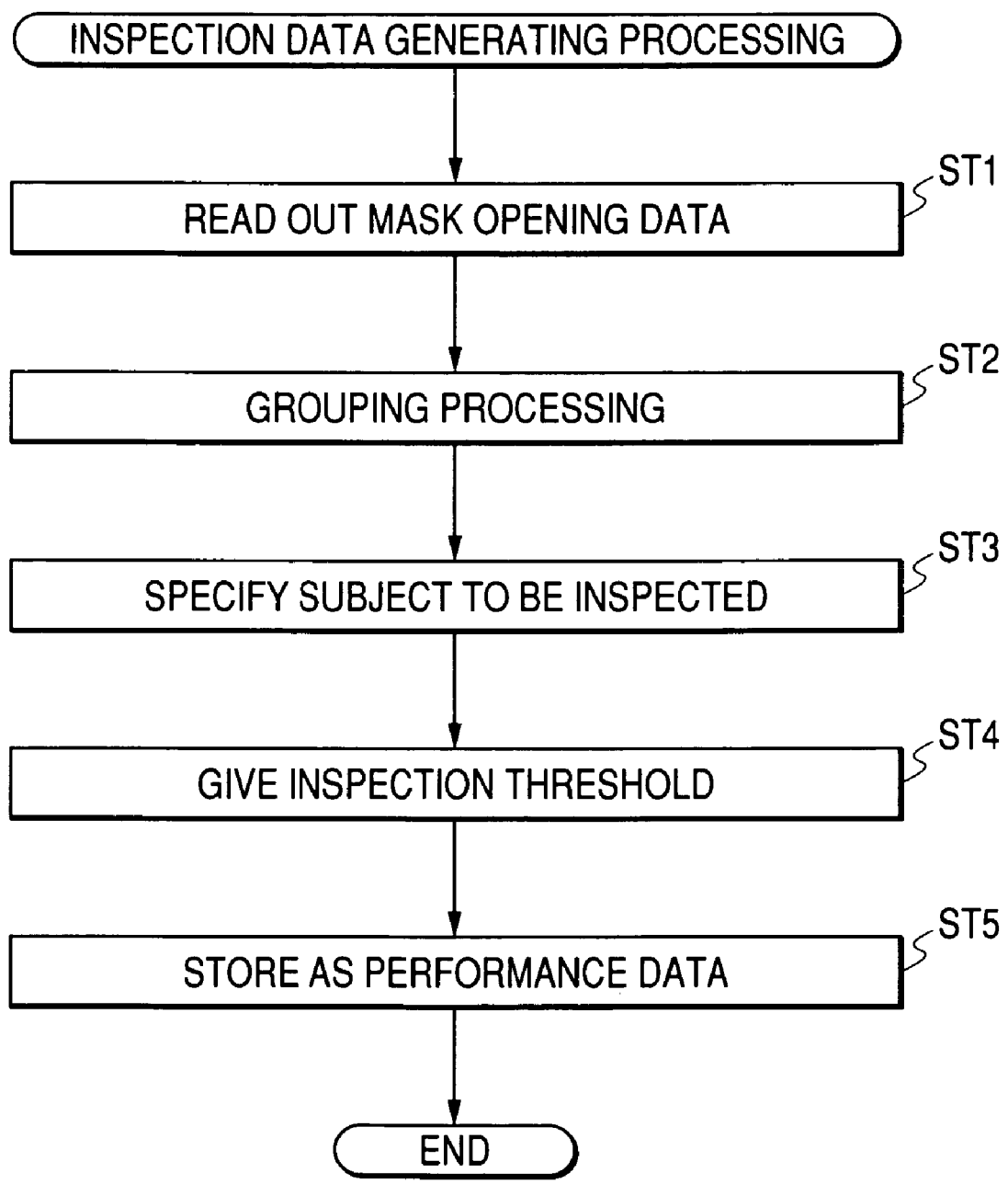
FIG. 10 is a flowchart detailing processing to generate printing inspection data according to one embodiment of the invention.
Figure 11:
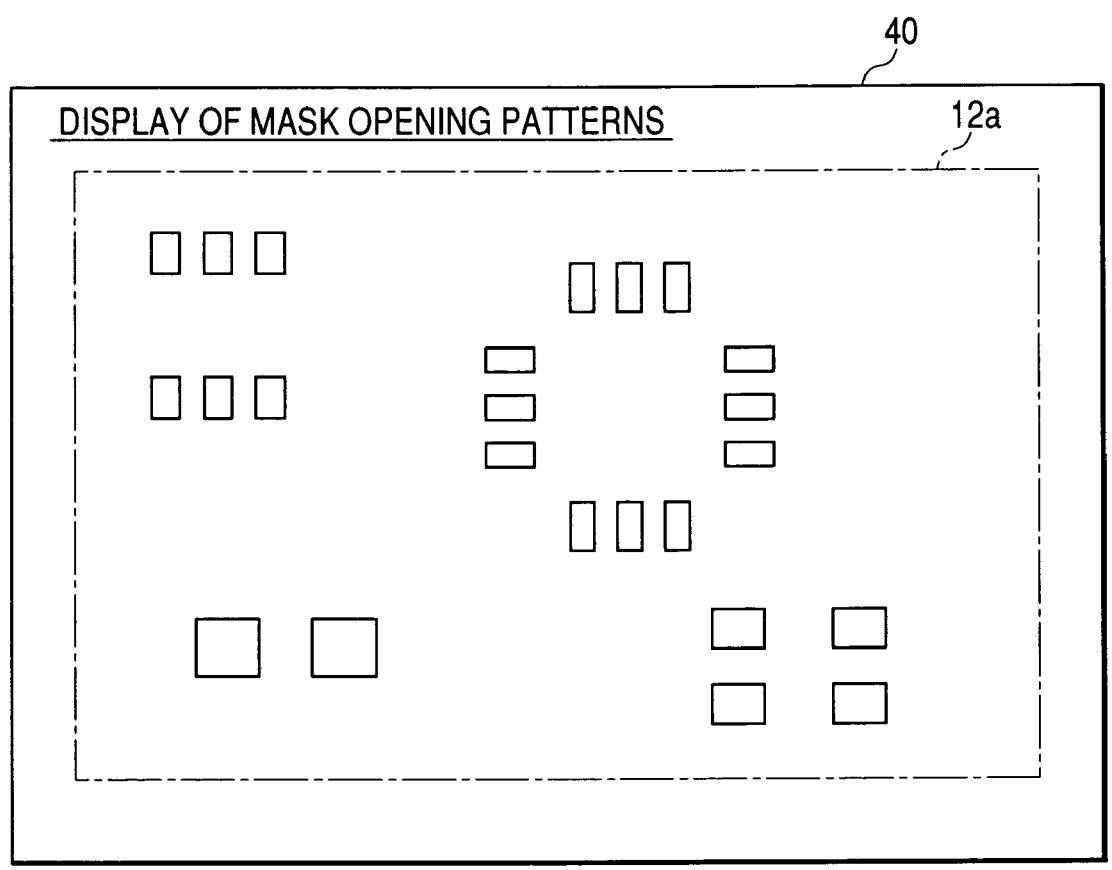
FIG. 11 is a view showing a display screen on a printing inspection apparatus according to one embodiment of the invention.

The following description will describe one embodiment of the invention with reference to the accompanying drawings. FIG. 1 is a front view of a screen printing apparatus according to one embodiment of the invention. FIG. 2 is a side view of the screen printing apparatus according to one embodiment of the invention. FIG. 3 is a plan view of the screen printing apparatus according to one embodiment of the invention. FIG. 4(a) and FIG. 4(b) are plan views of a substrate printing surface to be printed by the screen printing apparatus according to one embodiment of the invention. FIG. 5 is a block diagram depicting an arrangement of a control system of the screen printing apparatus according to one embodiment of the invention. FIG. 6 is a view showing storage contents in a program storage portion and in a data storage portion of the screen printing apparatus according to one embodiment of the invention. FIG. 7 is an explanatory view of element shape and position data of element solder print portions to be printed by the screen printing apparatus according to one embodiment of the invention. FIG. 8 is an explanatory view of packaging data and mask opening patterns used in the screen printing apparatus according to one embodiment of the invention. FIG. 9 is an explanatory view of an inspection threshold library of the screen printing apparatus according to one embodiment of the invention. FIG. 10 is a flowchart detailing processing to generate printing inspection data according to one embodiment of the invention. FIG. 11, FIG. 12, FIG. 13(a) through FIG. 13(c), and FIG. 14 are views each showing a display screen on a printing inspection apparatus according to one embodiment of the invention.

A structure of a screen printing apparatus will now be explained with reference to FIG. 1, FIG. 2, and FIG. 3. The screen printing apparatus is arranged in such a manner that it is furnished not only with a printing mechanism for printing cream solder on the substrate on which electronic components are mounted, but also with a function as a printing inspection apparatus that makes a go/no-go judgment of a printing state and a function as a printing inspection data generating apparatus for generating printing inspection data used in a printing inspection as will be described below.

Referring to FIG. 1 and FIG. 2, a substrate positioning portion 1 is formed of a movable table composed of an X-axis table 2 and a Y-axis table 3, a θ-axis table 4 stacked thereon, and a Z-axis table 5 provided on the θ-axis table 4. A substrate holding portion 7 for holding a substrate 6, which is pinched by a clamper 8, from below is provided on the Z-axis table 5. The substrate 6 as the subject to be printed is carried into the substrate positioning portion 1 by a carry-in conveyer 14 shown in FIG. 1 and FIG. 3. The substrate 6 moves in the X- and Y-directions as the substrate positioning portion 1 is driven, and is positioned at a printing position and a substrate recognition position described below. The post-printing substrate 6 is carried out by a carry-out conveyer 15.

A screen mask 10 is provided above the substrate positioning portion 1, and the screen mask 10 is composed of a holder 11 and a mask plate 12 attached thereto. The substrate 6 is positioned with respect to the mask plate 12 by the substrate positioning portion 1 and abuts against the mask plate 12 from below. As shown in FIG. 4(a), electrodes 6b, 6c, 6d, and 6e respectively used to bond electronic components P1, P2, P3 and P4 of different kinds are provided within a solder print range 6a on a circuit forming surface of the substrate 6.

A squeegee head 13 is provided above the screen mask 10 in such a manner that it is allowed to reciprocate in the horizontal direction. Cream solder 9 is supplied onto the mask plate 12 while the substrate 6 is abutting against the lower surface of the mask plate 12 and a squeegee 13a of the squeegee head 13 is allowed to slide on the surface of the mask plate 12 with pressing, whereby the cream solder 9 is printed on a printing surface of the substrate 6 through pattern holes 16 made in the mask plate 12. Consequently, as shown in FIG. 4(b), element solder print portions S1, S2, S3, and S4 are formed on the electrodes 6b, 6c, 6d, and 6e, respectively.

A camera 20 serving as image pick-up means is provided above the screen mask 10. As shown in FIG. 3, the camera 20 moves horizontally in the X- and Y-directions by an X-axis table 21 and a Y-axis table 22. The X-axis table 21 and the Y-axis table 22 function as camera moving means for moving the camera 20. Moving the camera 20 with respect to the mask plate 12 by the camera moving means allows the camera 20 to pick up an image of the mask plate 12 at an arbitrary position.

As shown in FIG. 2, the substrate positioning portion 1 is arranged in such a manner that it is moved in the Y-direction from below the screen mask 10 by the Y-axis table 3 to move the substrate 6 which is hold by it to the substrate recognition position. Moving the camera 20 to the substrate 6 on the substrate positioning portion 1 in this state allows the camera 20 to pick up an image of the substrate 6 at an arbitrary position.

An arrangement of a control system of the screen printing apparatus will now be explained with reference to FIG. 5. Referring to FIG. 5, a computation portion 25 is a CPU, which performs various arithmetical operations and processing described below by running various programs stored in a program storage portion 26. For these arithmetical operations and processing, data of various kinds stored in a data storage portion 27 is used.

A manipulation and input portion 28 is input means, such as a keyboard and a mouse, and is used to input various control commands and data. A communications portion 29 makes data transmission with other apparatuses forming an electronic component packaging line together with the screen printing apparatus. An image processing portion 30 performs image processing on image pick-up data from the camera 20, so that, as will be described below, it recognizes the solder print portions for a printing inspection and detects mask openings to generate printing inspection data.

A mechanism control portion 31 controls the camera moving means for moving the camera 20, and squeegee moving means for moving the squeegee head 13. A display portion 32 is a display apparatus, and serves as display means for displaying a manipulation screen during processing to generate printing inspection data and a judgment result of a printing inspection, both of which will be described below, in addition to an image obtained through the camera 20.

Programs and data stored in the program storage portion 26 and the data storage portion 27, respectively, will now be explained with reference to FIG. 6. Stored in the program storage portion 26 are a printing operation program 26a, an image processing program 26b, a printing go/no-go judging program 26c, a grouping processing program 26d, an inspection threshold giving processing program 26e.

The printing operation program 26a is a program for a printing operation to perform printing of the cream solder 9 on the substrate 6 by controlling operations of the substrate positioning portion 1 and the squeegee head 13. The image processing program 26b is a program that causes the image processing portion 30 to perform two kinds of processing described below based on an image pick-up result from the camera 20.

That is, element solder print portions (see FIG. 4(b)) formed on the respective electrodes on the substrate 6 are detected by subjecting an image pick-up result, which is a picked up image of the post-printing substrate 6, to recognition processing to calculate areas of the respective element solder print portions. Also, processing to find mask opening data indicating the positions and the shapes of the respective pattern holes 16 made in the mask plate 12 is performed by subjecting an image pick-up result, which is a picked up image of the mask plate 12, to recognition processing. The mask opening data thus obtained is used as inspection data in a printing inspection.

The printing go/no-go judging program 26c makes a go/no-go judgment of a printing state for each element solder print portion by comparing the area of each element solder print portion calculated by the image processing portion 30 with an inspection threshold (described below). In other words, a function achieved by running the printing go/no-go judging program 26c on the image processing portion 30 and the computation portion 25 forms printing judging means for making a go/no-go judgment of a printing state based on the image pick-up result of the substrate 6 and the inspection data needed to perform a printing inspection.

The grouping processing program 26d is a program to perform processing to divide individual element position and shape data indicating the positions and the shapes of the respective element solder printing portions into groups according a particular grouping condition in generating inspection data to be used in a printing inspection. In other words, a function achieved by running the grouping processing program 26d on the computation portion 25 forms grouping means for classifying the element shape and position data into data groups grouped according to a grouping condition to identify individual data groups.

The inspection threshold giving processing program 26e is a program to perform processing to give an inspection threshold to each of the data groups, which is the element position and shape data divided into groups. A function achieved by running the grouping processing program 26d on the computation portion 25 forms inspection threshold giving means for giving an inspection threshold, which is specific inspection data, to an individual data group.

Stored in the data storage portion 27 are packaging data 27a, a component data library 27b, a mask opening data library 27c, an inspection threshold library 27d, and performance data 27e. Of the foregoing data, the packaging data 27a, the component data library 27b, the mask opening data library 27c, and the inspection threshold library 27d are transferred from another apparatus, such as data managing computer, through the communications portion 29 and stored in the data storage portion 27.

The packaging data 27a is the data used for a packaging operation to mount electronic components on the substrate 6 after the cream solder 9 is printed, that is, it is the data correlating the kinds of electronic components to be mounted to mounting position coordinates on the substrate 6. The component data library 27b is the date related to individual electronic components to be mounted to the substrate 6, and it contains attribute data indicating component codes of electronic components, an accuracy needed for a packaging operation, difficulty levels in solder printing for bonding through soldering, etc., and numerical data representing the shapes and the sizes of components and the opening patterns for respective components indicating the layout of the element solder print portions at the time of bonding through soldering (see 33A, 33B, 33C, and 33D of FIG. 8) in numerical values.

The individual pattern holes 16 in the mask plate 12 can be correlated to electronic components corresponding to the solder print portions printed through these pattern holes 16 on data through the use of the packaging data 27a and the component data library 27b. Hence, as will be described below, a large variety of data can be linked to one another when printing inspection data is generated, and it is thus possible to improve efficiency of data generating processing.

The mask opening data library 27c stores the kinds of a large variety of numerical data indicating the positions and the sizes of the opening of the pattern holes 16 in the mask plate 12 used for printing, and it is given in advance as mask opening data accompanying with each mask plate 12. In other words, in the case of the mask plate 12 shown in FIG. 7, data as to the respective patterns 16a through 16d is given, and for example, as to the pattern holes 16c, dimensions a and b indicating the pattern hole size, position coordinate values of the respective pattern holes 16c, x1, x2, x3, and so forth and y1, y2, and so forth, with respect to the reference original point are given in the form of numerical data. The same can be said with the other pattern holes.

Although it will be described below, the mask opening data is used as the element position and shape data indicating the positions and the shapes of the element solder print portions (S1 through S4) shown in FIG. 4(b) in a printing inspection. Hence, the data storage portion 27 containing the mask opening data library 27c serves as data providing means for providing the element shape and position data indicating the shapes and the positions of the element solder print portions.

As has been described above, the data indicating the opening positions and the opening sizes of the pattern holes 16 can be obtained by picking up an image of the mask plate 12 by the camera 20. Hence, in a case where the mask opening data in need is not contained in the mask opening data library 27c, data same as the data shown in FIG. 7 can be obtained by using the actual mask plate 12. In this case, the camera 20 and the image processing portion 30 together serve as the data providing means for providing the element shape and position data obtained based on the mask opening data detected from the mask plate 12 to be used for screen printing.

Further, as a method of finding the element shape and position data, a method of combining data contained in the packaging data 27a and the component data library 27b may be adopted. To be more specific, as shown in FIG. 8, mounting points M1, M2A and M2B, M3, and M4 respectively indicating the mounting positions of electronic components P1, P2, P3, and P4 are found from the packaging data 27a, and respective components opening patterns 33A, 33B, 33C, and 33D in the component data library 27b are superposed on these mounting points, whereby numerical data equivalent to the mask opening data can be obtained.

The inspection threshold library 27d is a data library that provides data needed to calculate an inspection threshold used in a printing inspection. In this embodiment, as shown in FIG. 9, two kinds of libraries, a library correlated to the opening types of the pattern holes and a library correlated to the kinds of electronic components, are prepared as the inspection threshold library 27d.

In the library correlated to the opening types of the pattern holes, threshold data needed to calculate a threshold is preset for each opening type prepared in advance. More than one opening type of the pattern holes is set by combining the shapes of the pattern holes (square, rectangle, circle, etc.) and the size divisions. In other words, an inspection threshold based on the solder print area can be calculated by judging to which opening type an opening portion in question belongs.

Also, in the library correlated to the opening types of the pattern holes, the same threshold data can be found directly by specifying the kinds of electronic components (P1, P2 and so forth). In this case, an opening type does not have to be identified. In either case, the threshold data defines a normal range ((−)OK to (+)OK), a warning range ((−)Warning to (+)Warning), and the lower and upper limits of failure ((−)NG and (+)NG) of the areas of the respective element solder print portions on percentage with respect to the areas of the element solder print portions of their respective regular shapes.

The performance data 27e is the inspection data that is used actually in post-printing inspection performed subsequent to the solder printing, and as will be described below, it specifies the kind of a substrate as the subject to be printed. Further, by identifying ranges to be inspected on the substrate, inspection data corresponding to these inspection ranges is generated, which is stored into the data storage portion 27 as the performance data 27e.

The screen printing apparatus is arranged as described above, and processing to generate printing inspection data will now be explained with reference to the accompanying drawings along the flow of FIG. 10. The data generating processing is the processing to generate inspection data used in a printing inspection apparatus for inspecting a printing state of cream solder on the substrate after screen printing and containing at least the shape and position data indicating the shapes and the positions of the solder print portions formed by printing cream solder on the printing surface.

Referring to FIG. 10, the mask opening data is read out (ST1). Opening patterns indicating the layout of the opening portions within a print range 12a are thereby displayed on a manipulation screen 40 displayed on the display portion 32 for use in the data generating processing. The opening portions correspond to the element shape and position data indicating the shapes and the positions of the element solder print portions formed on the respective electrodes on the circuit forming surface.

In a case where mask opening data corresponding to the mask plate 12 as the subject to be processed is stored in the mask opening data library 27c of the data storage portion 27, this particular library data is used as the mask opening data. In a case where the library data is unavailable, processing to generate mask data equivalent to the library data from the packaging data 27a and the component data library 27b is performed. Further, in a case where the packaging data 27a and the component data library 27b are unavailable, data generating processing to generate the element shape and position data by detecting the opening portions from the image data obtained by picking up an image of the mask plate 12 as described above is performed.

Then, grouping processing is performed by classifying the element shape and position data corresponding to the respective pattern holes 16a, 16b, 16c, and 16d on display into data groups grouped according to a grouping condition to identify individual data groups (ST2). The grouping processing is the processing to divide individual element shape and position data into data groups by correlating the opening portions displayed on the manipulation screen 40 with one another according a predetermined grouping condition, and it is performed automatically through the grouping processing program 26d.

Figure 12:
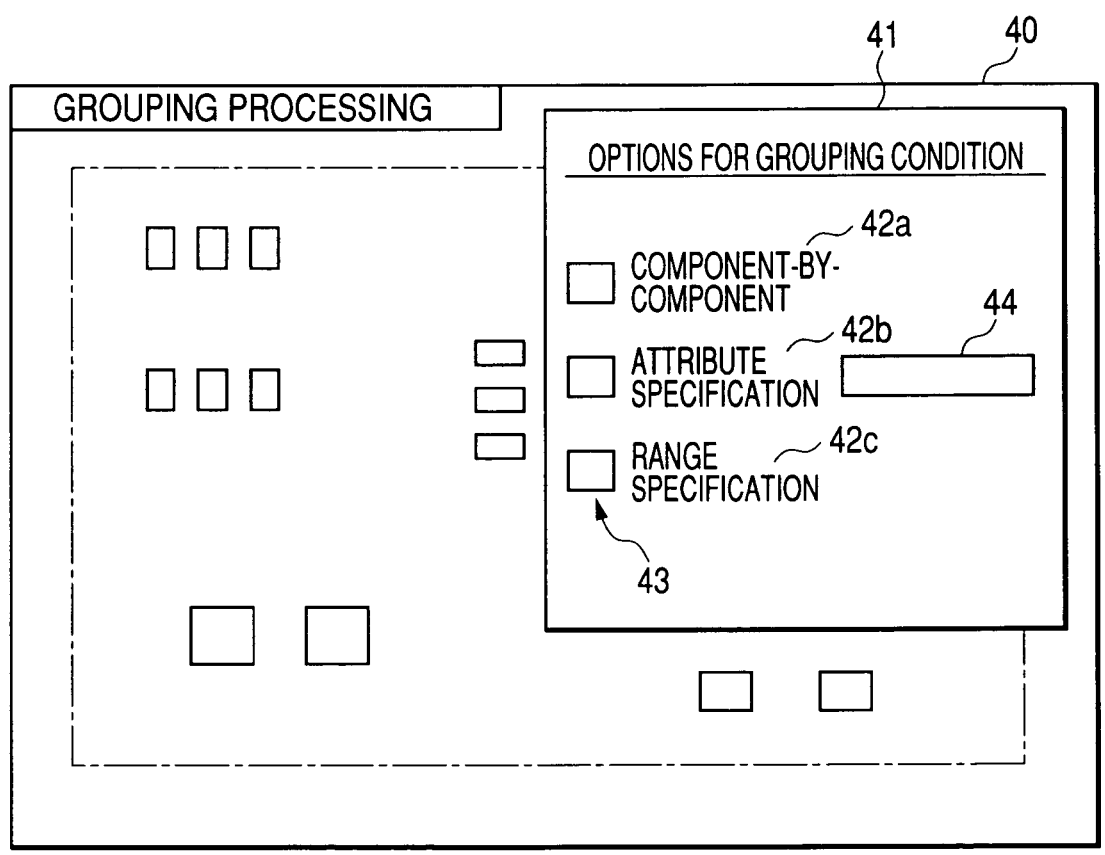
FIG. 12 is a view showing a display screen on the printing inspection apparatus according to one embodiment of the invention.

Herein, it is arranged in such a manner that one of three grouping conditions, that is, component-by-component 42a, attribute specification 42b, and range specification 42c, can be chosen by a grouping condition choosing wizard 41 displayed on the manipulation screen 40 shown in FIG. 12. The choice is made with check frames 43 provided for the respective options.

Figure 13A:
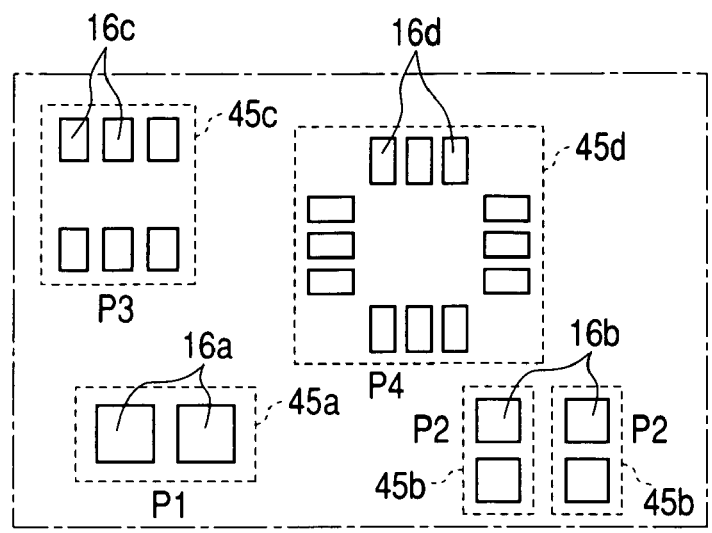
FIG. 13(a) through and FIG. 13(c) are views each showing a display screen on the printing inspection apparatus according to one embodiment of the invention.

When the component-by-component 42a is chosen, a grouping condition is determined so that each electronic component to be mounted on the substrate 6 forms one group. To be more specific, as shown in FIG. 13(a), the pattern holes 16a, 16b, 16c, and 16d corresponding to the electrodes (see FIG. 4(a)) provided to bond four electronic components P1, P2, P3 and P4 through soldering are enclosed with grouping frames 45a, 45b, 45c, and 45d, respectively. The element shape and position data corresponding to the individual pattern holes 16a, 16b, 16c, and 16d is thus classified into data groups grouped by electronic component, and these data groups are identified by the respective electronic components (P1, P2, and so forth).

Figure 13B:
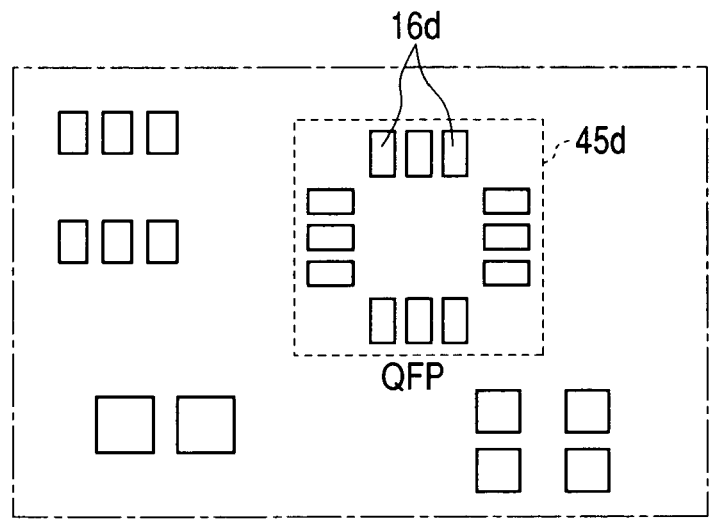

When the attribute specification 42b is chosen, the grouping condition is determined based on the attributes of the electronic components. To be more specific, of all the electronic components to be mounted, only the electronic component having the attribute identified by an input in the specification input frame 44 becomes the subject to be grouped. For example, when the kind, "QFP", of electronic components is specified as the attribute, then, as shown in FIG. 13(b), only the pattern holes 16d corresponding to the electronic component P4 of the specified kind are enclosed with the grouping frame 45d. The element shape and position data corresponding to the pattern holes 16d are thereby classified into a data group grouped by input attribute and other data group than the data group grouped, and the data group thus grouped is identified by the attribute, "QFP".

Figure 13C:
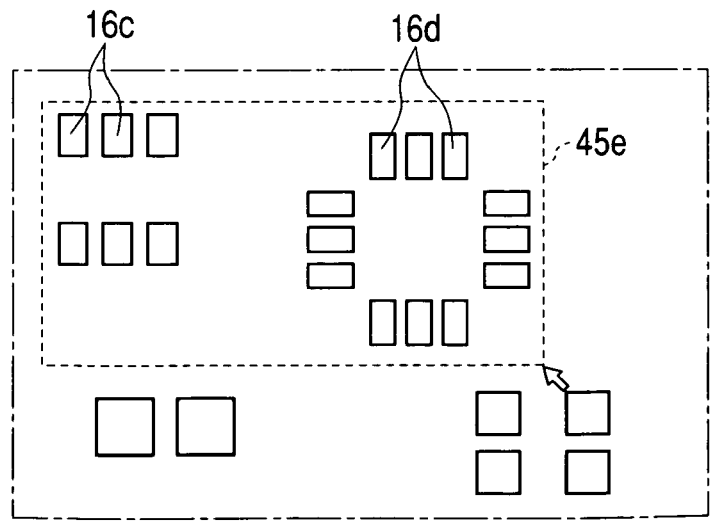

When the range specification 42c is chosen, the grouping condition is determined based on a geometrical range on the printing surface of the substrate 6. In this case, as shown in FIG. 13(c), a manipulation is performed to set a grouping frame 45e that encloses only the pattern holes (herein, the pattern holes 16c and 16d), which are the subjects to be grouped, with a pointing device, such as a mouse, on the manipulation screen 40. The element shape and position data corresponding to these pattern holes is thereby classified into a data group grouped by geometrical range determined by the frame setting manipulation and other data group than the data group grouped, and the data group thus grouped is identified by the characteristic of the specified range (for example, a range within which the same inspection threshold is given, a range subjected to a printing inspection, etc.).

When the grouping processing is completed as has been described, a subject to be inspected is specified (ST3). Herein, whether the data groups classified in the grouping processing are to be subjected to a printing inspection subsequent to the screen printing is specified. In this embodiment, as a rule, the range enclosed with the grouping frame in the grouping processing becomes the subject to be inspected. In other words, in the case of the attribution specification 42b and the range specification 42c, the grouped range directly becomes the subject to be inspected. Then, the printing judging means described above judges a printing state using only the data group belonging to the range grouped as the subject to be inspected.

In a case where the component-by-component 42a is chosen, the pattern holes corresponding to all the electronic components become the subjects to be grouped. However, in this case, when a printing inspection is judged as unnecessary for anyone of the electronic components, a manipulation to release the grouping is performed on the manipulation screen 40. Processing is then performed so that the pattern holes on which the grouping is released are removed from the subjects to be inspected.

In a printing inspection, not the entire substrate has to be inspected. Although, it is necessary to set the ranges to be the subjects to be inspected delicately for each inspection depending on the time and quality needed for the inspection, by adopting the method as described above, an easy and flexible setting manipulation method can be achieved in this embodiment.

Then, an inspection threshold is given (ST4). To be more specific, an inspection threshold is given, as specific inspection data, to a data group specified as the subject to be inspected, and the inspection thresholds are given at a time to a plurality of pattern holes belonging to each specified data group. It is thus possible to perform data processing to give an inspection threshold with ease even in a case where the substrate having an enormous number of pattern holes is the subject to be inspected.

The inspection data given with the inspection threshold for the respective data groups is stored into the data storage portion 27 as the performance data 27e (ST5). In the flow, the grouping processing (ST2), specifying of the subject to be inspected (ST3), and giving of the inspection threshold (ST4) are not necessarily performed in the order of description, and they may be performed for individual data groups in any order.

Subsequently, a screen printing work is started. Initially, the cream solder 9 is supplied onto the mask plate 12, and the substrate 6 is allowed to abut against the lower surface of the mask plate 12. Then, the squeegee head 13 is moved, and the cream solder 9 is printed onto the respective electrodes 6b through 6d on the substrate 6 through the pattern holes 16a through 16c, respectively. Then, the substrate 6 is separated from the mask plate 12 by moving the Z-axis table 5 downward, whereby the element solder print portions S1 through S4 (see FIG. 4(b)) are formed respectively on the electrodes on the substrate 6.

Subsequently, a printing inspection is performed. The printing inspection is performed by moving the substrate positioning portion 1 again to the substrate recognition position (see FIG. 2) from below the screen mask 10, picking up an image of the top surface of the post-printing substrate 6 by the camera 20, and detecting areas of the element solder print portions S1 through S4. An go/no-go judgment of a printing state is made by comparing the area detection result with the inspection threshold found based on the inspection threshold library 27d (printing judging step).

Herein, a final judgment of a printing state is made in connection with the data groups grouped according to the grouping condition, and the judgment result is correlated with the data groups as well and is thereby displayed group by group. For example, when the grouping is performed by component, judgment and display of the judgment result are performed component by component. In other words, when all the element solder print portions corresponding to each electronic component are satisfactory, solder printing for any particular electronic component is judged as being satisfactory. With the presence of only a single element solder print portion that is in an unsatisfactory printing state, solder printing for this particular electronic component is judged as being in an unsatisfactory printing state.

Figure 14:
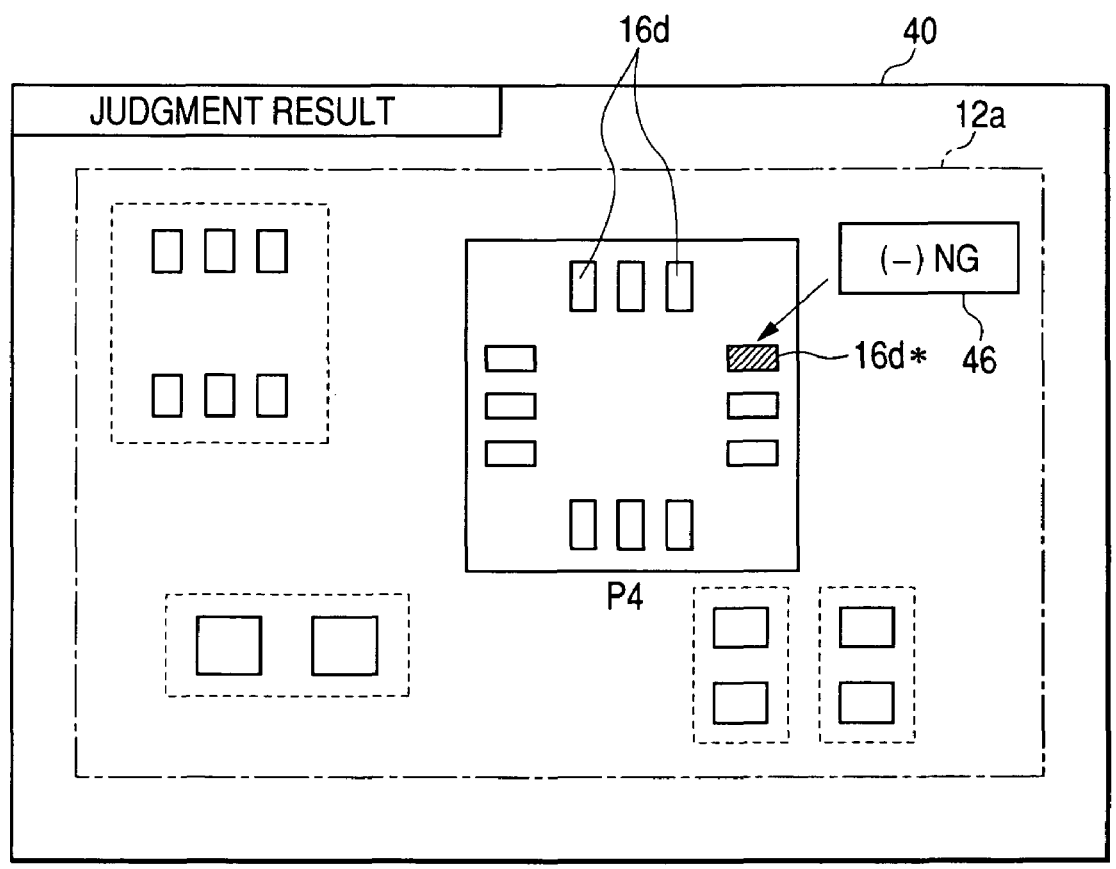
FIG. 14 is a view showing a display screen on the printing inspection apparatus according to one embodiment of the invention.

These judgment results are displayed on the manipulation screen 40 (display step). FIG. 14 shows an example of a display of the judgment results. The judgment results are displayed in connection with the divided data groups, and the example herein shows a case where the display of the judgment results is performed by both electronic component and element solder print portion. For example, as to an electronic component for which solder printing is judged as being satisfactory because the solder print portions corresponding to this particular electronic component are all satisfactory, any special display is not shown on the screen. On the contrary, a display indicating a defect is shown for an element solder print portion on which a no-go printing state is detected and an electronic component corresponding to this element solder print portion.

The example shown in FIG. 14 shows a case where a defect is detected on one of the solder print portions printed through the pattern holes 16d to correspond to the electronic component P4, and it is arranged in such a manner that the frame enclosing the electronic component P4 is displayed inversely, so that a defective portion can be readily confirmed in the unit of electronic component. Also, the pattern hole 16d* corresponding to the element solder print portion on which a defect is detected is displayed inversely, and a display column 46 indicating a defect content is displayed for each defect-detected pattern hole.

As has been described, the printing inspection of this embodiment uses printing inspection data, which is generated by dividing the element shape and position data indicating the shapes and the positions of the element solder print portions formed on the electrodes through printing into groups according to the grouping condition chosen in response to the substrate as the subject to be inspected. It is thus possible to perform data processing efficiently in generating the printing inspection data even when the subject to be inspected is a substrate having an enormous number of electronic components.

Hence, a flexible inspection mode in responding to the characteristics of the substrate and the electronic components to be mounted on the substrate is enabled, which makes it possible to achieve an optimal inspection mode in which a balance is kept between the improvement of production efficiency and the securing of a printing accuracy. Also, because the judgment result of the printing inspection is displayed in desired divisions, such as by electronic component and by kind of component, a defective portion can be readily identified and useful quality management data can be obtained.

This embodiment described a case where a post-printing inspection is performed by the screen printing apparatus furnished with a printing inspection function. However, the arrangement shown in this embodiment can be applied even in a case where a special printing inspection apparatus is provided separately besides the screen printing apparatus.

Also, as has been described, when the printing inspection data of this embodiment is generated, the element shape and position data indicating the shapes and the positions of the element solder print portions formed on the electrodes through printing is divided into groups according to the grouping condition chosen in response to the substrate as the subject to be inspected. It is thus possible to perform data processing efficiently in generating the printing inspection data when the subject to be inspected is a substrate having an enormous number of electronic components.

Further, by using a method of detecting opening portions in the actual mask plate as the method of obtaining the element shape and position data, the user can readily generate the inspection data even when he has not obtained detailed data, such as original mask opening data and packaging data. Consequently, even when the limited production of diversified products is adopted, delicate quality management can be ensured by performing an inspection.

This embodiment described a case where the inspection data is generated by the screen printing apparatus furnished with a function of generating inspection data. However, the arrangement shown in this embodiment can be applied even in a case where a special inspection data generating apparatus is provided separately besides the screen printing apparatus.

According to the invention, a printing state is judged by comparing the inspection data, which is generated by classifying unit shape and position data indicating the shapes and positions of unit print portions to be printed on the electrodes into data groups grouped according to a grouping condition, with an image pick-up result of the substrate from the image pick-up means, and a judgment result is displayed in connection with the data groups. It is thus possible to perform an inspection according to importance or the order of priority of the inspection set in response to a kind of the substrate; moreover, it is possible to achieve an optimal inspection mode in which a balance is kept between the improvement of production efficiency and the securing of a printing accuracy.

Also, according to the invention, the element shape and position data indicating the shapes and the positions of the element solder print portions to be printed on the electrodes provided on the circuit forming surface of the substrate to be used to bond electronic components is divided into groups according a grouping condition. It is thus possible to perform data processing of the inspection data efficiently.

What is claimed is:

1. A printing inspection apparatus for inspecting a printing state of cream solder printed through pattern holes on a substrate after screen printing, said apparatus comprising:
   image pick-up means for picking up an image of said substrate;
   printing judging means for making a go/no-go judgment of the printing state based on an image pick-up result of said substrate from said image pick-up means and inspection data needed to perform a printing inspection;
   display means for displaying a judgment result; and
   grouping means for classifying and grouping solder element shape and position data corresponding to a plurality of the pattern holes into at least one data group which is grouped according to a grouping condition apart from other data group, wherein the grouped data is identified by the grouping condition,
   wherein said display means displays the judgment result in connection with the data groups, and
   wherein said grouping means comprises grouping condition choosing means for choosing the grouping condition and a grouping frame for enclosing images of only the pattern holes corresponding to the chosen grouping condition.

2. The printing inspection apparatus according to claim 1, wherein:
   the grouping condition is determined based on a geometrical range on a printing surface of said substrate; and
   said printing judging means makes a judgment of the printing state using a data group grouped as an inspection performance range.

3. The printing inspection apparatus according to claim 1, wherein:
   the grouping condition is determined based on an attribute of said electronic components; and
   said printing judging means makes a judgment of the printing tate using a data group grouped as an electronic component having an attribute specified as a subject to be inspected.

4. The printing inspection apparatus according to claim 1, wherein:
   the grouping condition is determined so as to make a one-to-one correspondence between said electronic components and the data groups; and
   said display means displays the judgment result for each data group.

5. A printing inspection method for inspecting a printing state of cream solder printed through pattern holes on a substrate after screen printing by using a printing inspection apparatus, said method comprising the steps of:
   making a go/no-go judgment of the printing state based on inspection data generated by grouping unit shape and position data corresponding to a plurality of the pattern holes into at least one data group which is grouped according to a grouping condition apart from other data group, wherein the grouped data is identified by the grouping condition, and an image pick-up result of said substrate from image pickup means; and
   displaying a judgment result in connection with the data groups,
   wherein said method further comprises the steps of choosing the grouping condition and enclosing images of only the pattern holes corresponding to the chosen grouping condition.

6. The printing inspection method according to claim 5, wherein:
   the grouping condition is determined based on a geometrical range on a printing surface of said substrate; and
   a judgment of the printing state is made by using a data group grouped as an inspection performance range.

7. The printing inspection method according to claim 5, wherein:
   the grouping condition is determined based on an attribute of said electronic components; and
   a judgment of the printing state is made by using a data group grouped as an electronic component having an attribute specified as a subject to be inspected.

8. The printing inspection method according to claim 5, wherein:

the grouping condition is determined so as to make a one-to-one correspondence between said electronic components and the data groups; and the judgment result is displayed for each data group.

9. A printing inspection data generating apparatus for generating inspection data used in a printing inspection apparatus for inspecting a printing state of cream solder printed through pattern holes on a substrate after screen printing and containing shape and position data indicating shapes and positions of solder print portions formed by printing the cream solder on a printing surface, said printing inspection data generating apparatus comprising:

data providing means for providing element shape and position data indicating shapes and positions of element solder print portions formed on respective electrodes provided on a circuit forming surface of said substrate to be used to bond electronic components; and grouping means for classifying and grouping the element shape and position data into data groups which is grouped according to a grouping condition to identify at least one data group according to the grouping condition apart from other data group than the data group grouped, wherein said grouping means comprises grouping condition choosing means for choosing the grouping condition and a grouping frame for enclosing images of only the pattern holes corresponding to the chosen grouping condition.

10. The printing inspection data generating apparatus according to claim 9, wherein:

the grouping condition is determined based on a geometrical range on the printing surface of said substrate.

11. The printing inspection data generating apparatus according to claim 9, wherein:

the grouping condition is determined based on an attribute of said electronic components.

12. The printing inspection data generating apparatus according to claim 9, wherein:

the grouping condition is determined so as to make one group for each of said electronic components.

13. The printing inspection data generating apparatus according to claim 9, further comprising specific inspection data giving means for giving specific inspection data to the individual data groups.

14. The printing inspection data generating apparatus according to any of claims 9 through 13, wherein:

said data providing means provides element shape and position data obtained based on mask opening data detected from a mask plate to be used for the screen printing.

15. A printing inspection data generating method for generating inspection data used in a printing inspection apparatus for inspecting a printing state of cream solder printed through pattern holes on a substrate after screen printing and containing shape and position data indicating shapes and positions of solder print portions formed by printing the cream solder on a printing surface, wherein:

element shape and position data corresponding to a plurality of the pattern holes is grouped into at least one data group which is grouped according to a grouping condition apart from other data group, wherein the grouped data is identified by the grouping condition, wherein said method comprises the steps of choosing the grouping condition and enclosing images of only the pattern holes corresponding to the chosen grouping condition.

16. The printing inspection data generating method according to claim 15, wherein:

the grouping condition is determined based on a geometrical range on the printing surface of said substrate.

17. The printing inspection data generating method according to claim 15, wherein:

the grouping condition is determined based on an attribute of said electronic components.

18. The printing inspection data generating method according to claim 15, wherein:

the grouping condition is determined so as to make one group for each of said electronic components.

19. The printing inspection data generating method according to claim 15, wherein:

specific inspection data is given to the individual data groups.

20. The printing inspection data generating method according to any of claims 15 through 19, wherein the element shape and position data is provided based on mask opening data detected from a mask plate to be used for the screen printing.

* * * * *

UNITED STATES PATENT AND TRADEMARK OFFICE
CERTIFICATE OF CORRECTION

| | | |
|---|---|---|
| PATENT NO. | : 7,630,536 B2 | Page 1 of 1 |
| APPLICATION NO. | : 10/626140 | |
| DATED | : December 8, 2009 | |
| INVENTOR(S) | : Fukagawa et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 924 days.

Signed and Sealed this

Second Day of November, 2010

David J. Kappos
*Director of the United States Patent and Trademark Office*